United States Patent [19]

Machida

[11] Patent Number: 4,784,920
[45] Date of Patent: Nov. 15, 1988

[54] THIN FIBER-REINFORCED PLASTIC COMPOSITE PLATE AND METHOD OF MOLDING THE SAME

[76] Inventor: Terufumi Machida, No. 6-8-9-406, Tsurukawa, Machida-shi, Tokyo, Japan

[21] Appl. No.: 46,362

[22] Filed: May 6, 1987

[30] Foreign Application Priority Data

May 6, 1986 [JP] Japan ................................ 61-102168

[51] Int. Cl.⁴ ............................................ B32B 17/12
[52] U.S. Cl. .............................. 428/542.8; 156/306.9; 264/259; 428/302
[58] Field of Search ...................... 156/306.9; 264/259; 428/98, 302, 542.8

[56] References Cited

U.S. PATENT DOCUMENTS

| 3,660,199 | 5/1972 | Riccitiello et al. | 428/413 X |
| 3,666,600 | 5/1972 | Yoshino | 156/285 X |
| 4,044,188 | 8/1977 | Segal | 428/283 |
| 4,581,284 | 4/1986 | Eggert et al. | 428/285 X |

Primary Examiner—Henry F. Epstein
Attorney, Agent, or Firm—Sughrue, Mion, Zinn, Macpeak, and Seas

[57] ABSTRACT

A method for fabricating a plastic fiber-reinforced composite plate in which thin fiber-reinforced plates are separately molded and then laminated. The laminated structure is then hardened by simultaneous pressing and heat treating.

7 Claims, 2 Drawing Sheets

THIN FIBER-REINFORCED PLASTIC COMPOSITE PLATE AND METHOD OF MOLDING THE SAME

BACKGROUND OF THE INVENTION

Field of the Invention

The present invention relates generally to thin fiber-reinforced plastic composite plates widely used, for example, for base materials of electronic parts, aircraft parts, covers or containers of various appliances, etc., in various fields. In particular, the invention relates to a method of molding such a thin fiber-reinforced plastic composite plate.

Background of the Invention

Generally, it is not easy to obtain fiber-reinforced plastic moldings having a very thin thickness, for example, of 2 mm or less. In an injection molding method which is most used at present, a fiber-reinforced plastic material must be extremely thin, for example, not thicker than 2 mm so that the fibers are allowed to move easily together with the fused plastic. Further, the productivity has not been able to reach a high level, unlike the case of manufacturing metal thin plates in which high speed mass production can be effected.

In the case where fibers, particularly long fibers, are included in the plastic molding, it is not easy to control the movement of the fibers in other methods for molding plastics such as blow molding, compression molding, or the like. As an improved measure, however, there is a hand lay-up method in which layers of glass-fiber cloth are stacked one on another while being impregnated with resin. As other measures, fiber-reinforced plastics molding methods employing a machine such as a metal-working press are practically used. Those methods include, for example, a sheet-mold compound method (SMC method) and a heat molding method for fiber-reinforced thermoplastic plastics (stampable sheet).

On the other hand, the pressing of the above-mentioned stampable sheet has recently been anticipated as a method in which thin plate moldings can be obtained by a widely used stamping method for thin metal plates and by using a machine having a high speed mass production property. According to this method, a 3–10 mm thick sheet of Nylon or polypropylene containing 30–70% of glass fibers or the like is pressed while being heated. The pressed sheet is then cooled to thereby obtain a shallow container or other body having a desired shaped. The procedure, however, is not suitable for a plate thinner than 3 mm. This is because obtaining such an extremely thin plate of fiber-reinforced plastics is considered difficult from the industrial viewpoint as described above.

Further, in carrying out press-working on the resin plate of the kind as described above, it is extremely difficult to obtain a complicated molding with substantial deformation of the resin plate. For example, assume that two kinds of thin plates, one being very thin and the other being thick, are simply bent by using presses having the same apex angle and the same radius, as shown in FIGS. 1a and 1b, respectively. In the case of FIG. 1a where the plate is very thin, a little quantity of extensional deformation is generated on the outside of the thin plate and the inside of the thin plate is well fitted to the shape of a tool. However, in the case of a thick plate, as shown in FIG. 1b, the quantity of outside extensional deformation is so large that a crack h is caused, and the fibers may be broken to lose their reinforcing effect because the fibers per se are generally rigid and cannot be stressed. Also, a bending stress remains in the fibers to prevent straightening the inside of the thin plate even if the fibers could be bent. That is, it must be said that accurate working is very difficult to perform on the fiber-reinforced thermoplastic resin plate of this kind.

SUMMARY OF THE INVENTION

It is therefore an object of the present invention to solve the foregoing problems in the prior art.

In particular, it is object of the present invntion to provide a thin fiber-reinforced plastic composite plate which has high accuracy when used for moldings and which has good workability as well as good productivity.

It is a further object of the present invention to provide a molding method of the above-mentioned thin fiber-reinforced plastic composite plate according to the invention.

In order to attain the above objects, according to an aspect of the present invention, the thin fiber-reinforced plastic composite plate comprises a lamination structured composed of a plurality of laminated thin fiber-reinforced plastic plates each molded in an approximate shape, the lamination structure being integrally hardened through pressing and heating.

According to another aspect of the present invention, the method of molding a thin fiber-reinforced plastic composite plate comprises the steps of laminating a given number of thin fiber-reinforced plastic plates each molded in an approximate shape to thereby obtain a lamination structure and hardening the lamination structure while pressing and heat fusing the lamination structure to thereby obtain the thin fiber-reinforced plastic composite plate.

The method according to the present invention has been attained as a result of much investigation and many experiments. This promising method has been attained on the basis of principles as follows: (1) If a plate is thin, the bending distortion (quantity of extensional deformation) on the outer surface of the thin plate is not made large even if the thin plate is bent; (2) Not only a base material of the plate but reinforcing fibers contained in the base materials are, therefore, never damaged; (3) A thin body having a desired shape and a desired length can be obtained with no difficulty if thin bodies each having a desired shape are separately molded in advance and then the moldings are laminated one on one; and (4) Being thin, the individual plate having the desired shape can be easy fit to a mold, so that the finished shape is good.

BRIEF DESCRIPTION OF THE DRAWINGS

FIGS. 2(a)–2(c) respectively show the prepreg plates of FIGS. 2(a)–2(c) after a step of press-molding;

DETAILED DESCRIPTION OF PREFERRED EMBODIMENTS

Figure 1A:
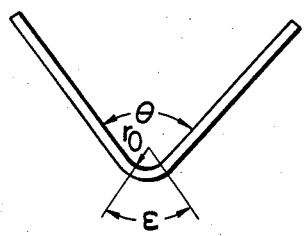
FIGS. 1a and 1b are diagrams for comparison between the states in which a thin plate and a thick plate are bent to be deformed, respectively.
Figure 1B:
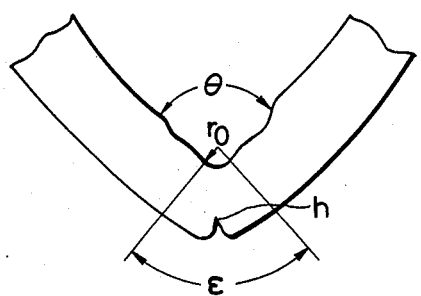

Referring to the drawings, embodiments according to the present invention will be described hereunder.

The base material used according to the present invention is an extremely thin plate called a prepreg and is made of an unhardened or uncured (before curing) thermosetting resin such as epoxy, polyester, or the like, and thermoplastic resin such as Nylon, polypropylene, or the like, containing therein a desired quantity (generally, 20 through 70 weight %) of glass fibers, carbon fibers, polyaramide (KEVLAR: trade name) fibers, metal fibers, or any other fibers.

Figure 2:
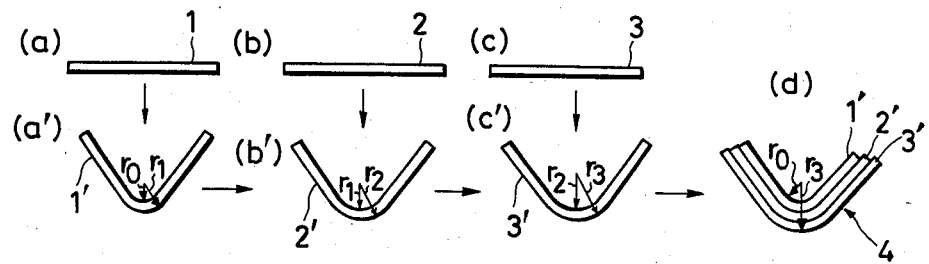
FIGS. 2(a)–2(c) shows successive prepreg plates for molding and pressing according to a first embodiment of the method of molding and pressing a thin-fiber reinforced plastic composite plate according to the present invention.
FIG. 2(d) shows a composite, laminated prepreg plate including the prepreg plates of FIGS. 2(a)–2(c)

A prepreg 1 is cut at a desired size (see part(a) of FIG. 2), and is subject to press-working to be made into a desired shape in a first press (see part (a') of FIG. 2). Being in a not-hardened or uncured state and being an extremely thin plate (generally 0.2 through 0.5 mm thick), the prepreg 1 can be easily molded to have a desired shape without damaging the reinforcing fibers as described above. The press mold not only functions to apply a desired shape to the pregpreg but also functions to maintain heating to harden the prepreg to a limited extent to preserve the obtained shape. The thus molded prepreg (hereinafter referred to as "a preform") 1' is cooled and then preserved in a refrigerator or the like. Another prepreg 2 is cut (see part (b) of FIG. 2) and is then fed to a press to thereby obtain a second preform 2' (see part (b') of FIG. 2).

At this time, it is important that the dimension of the male tool in the second press must be made to agree with the dimension of the female tool of the first press at least at an important shape portion thereof. An example in which prepregs are bent to obtain V-shape preforms is considered. Assume that a first preform is molded by bending a prepreg having a thickness of 0.2 mm by using a tool having an inner radius 0.5 mm. Then, the outer radius of a second preform is 0.7 mm which is a sum of 0.2 mm and 0.5 mm, so that a tool having an inner radius of 0.7 mm must be used in the second press.

Thus, the prepreg 2 is given a desired shape and the shape is kept while the prepreg 2 is heated. It is then cooled so that a partially hardened second preform 2' is obtained (see part (b') of FIG. 2) similar to the first preform 1'. In the same manner, a third preform 3' is obtained from a third prepreg 3 (see parts (c) and (c') FIG. 2). Thus, mold tools are designed such that the outer configuration of the n-th preform agrees with the inner configuration of the (n+1)-th preform.

All the thus molded preforms are laminated one on one so as to obtain a composite preform having a desired thickness. Then, the composite preform is pressed in a press, shown in FIG. 3, and heated to be hardened or subjected to curing to thereby obtain a thin fiber-reinforced plastic composite plate 4 (see part (d) of FIG. 2). More specifically, a preform lamination structure is obtained in such a manner that the first preform having the smallest radius curved portion is put at the innermost side and the second, the third, ... n-th preforms having successively larger radii of their respective curved portions are successively put outside the first prepreg, the second prepreg, ... n-th prepreg in the order of dimension of radius at the cured portion. The so assembled lamination structure is put in a press mold and heated to be hardened or subjected to curing while being pressed. When the preform lamination structure is sufficiently pressed and heated, the respective preforms laminated one on one react with each other with resin contained therein so as to be substantially completely integrated with each other.

Figure 3:
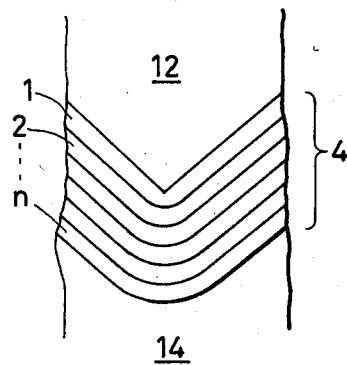
FIG. 3 illustrates the pressing and curing of a laminated structure of FIG. 2.

In the embodiment described above, the preforms 1', 2', ... n' are obtained form the prepregs 1, 2, ... n, and the laminated preforms are fused and hardened, as shown in FIG. 3, in a punch 12 and a die 14 in the last press so as to obtain the desired thin fiber-reinforced plastic composite plate 4. In the case where the whole thickness is thin, however, it is of course possible to obtain a preform from a lamination of prepregs.

Figure 4:
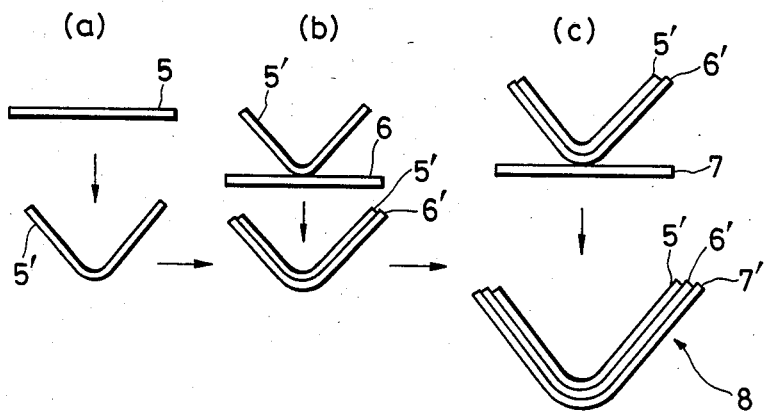
FIGS. 4(a)-4(c) are connected diagrams showing successive molding and pressing steps a second embodiment of the method according to the present invention.

FIG. 4 shows another embodiment according to the present invention. This is a method in which preforms and prepregs are alternately laminated to obtain a thin composite plate. A first preform 5' is obtained by a first press from a prepreg 5 cut at a suitable length (part(a) of FIG. 4). A second prepreg 6 is disposed under the first preform 5' in a second press, and the first preform 5' and the second prepreg 6 are simultaneously compressed on a metal mold to thereby obtain the laminated preforms 5' and 6' (see part(b) of FIG. 4). In the same manner, a third prepreg 7 is disposed under the laminated preforms 5' and 6' and the laminated third prepreg 7 and preforms 5' and 6' are simultaneously compressed on a third metal mold to thereby obtain the laminated preforms 5', 6', and 7' (see part (c) of FIG. 4). Then, the laminated preforms 5', 6', and 7' are successively added with further prepregs while successively increasing the whole thickness by the thicknesses of the added prepregs. The final lamination structure so produced is heated to be hardened or subjected to curing to thereby harden the thus molded thin fiber-reinforced plastic composite plate 8. The method has an advantage that male molds or punches become unnecessary according to circumstances.

As described above, according to the present invention, the thin fiber-reinforced plastic composite plate is obtained in such a manner that a desired number of thin fiber-reinforced plastic plates each molded in approximate shapes are laminated one on one, and heat molded by being pressed while being heated to be fused and hardened. Accordingly, the fiber-reinforced products of extremely thin plates can be efficiently manufactured, with high productivity and workability. Further, the fibers are not damaged but kept continuous at any portion of the shape, so that the reinforcing effect can be realized to a maximum to keep the stability and quality of the products. In any of the press steps, the orientation of the prepregs or the fibers thereof can be set as desired, so that the orientation of strength of each of the preforms or the laminated products can be controlled.

Not only a hybrid, that is, a molded body in which prepregs containing two kinds or more of fibers are laminated can be also easily obtained but the method can be applied to other cases where other plastic materials than the fiber-reinforced plastics are laminated. Accordingly, the method is of great utility.

Examples of the present invention will be described hereunder.

EXAMPLE 1

This example is explained with reference to FIG. 2. Assume that a bent lamination molding is to be obtained by using unidirectional-fiber-arrangement prepregs (0.2 mm thick) containing 60% of glass fibers and 40% of epoxy resin. Six pairs of V-bending molds each having an apex angle of 90 degrees were set in a compression molding press having a capacity of two tons. The radii of the respective apex angles (bending radii) were 0, 0.2, 0.4, 0.6, 0.8, and 1.0 mm. Six thin prepregs (only three are shown in FIG. 2) were individually set in the separate metal molds so that the angles between the bending lines of the V-shapes and the fibers were respectively 90°, 0°, 90°, 0°, 90° and 0°. The thus set six prepregs were heated at a temperature of 120° C. for ten minutes while being pressed at a whole pressure of 600 kgf. Thereafter, they were cooled by cold blown air, so that six kinds (six sheets) of preforms were obtained. Further, the thus obtained six preforms were successively laminated between the punch 12 (a male mold), shown in FIG. 3, having an apex angle radius of 0 mm (i.e., a sharp corner) and the die 14 (a female mold) having a inner-apex-angle radius 1.2 mm. The apex angles were 90°. The so laminated preforms were heated once more at a temperature of 150° C. while being pressed at a pressure of 600 kgf so as to be fused and hardened or subject to curing to thereby obtain a 90° V-bent molding which was 1.18 mm thick, 70 mm wide, and 70 mm long. The hardness of the flat portions in the opposite sides showed a sufficient value, that is, "Barchol 934-1 hardness" (JIS K6911-1979), and the tensile stength was measured at 7 to 15 kgf/mm$^2$ with a result that peeling or any other important defect due to the manner of manufacturing method could not be found before and after the application of tension.

EXAMPLE 2

A bent molding of a thin unidirectionally reinforced hybrid composite plate in which prepregs similar to those used in Example 1 and unidirectional-fiber-arrangement prepregs containing 70% of polyaramide (KEVLAR: trade name) fibers and 30% of epoxy resin were alternately laminated, was obtained in the same manner as Example 1. As a result of visual inspection, there was no problem in the continuity of the fibers and in the fusing relation between the layers.

What is claimed is:

1. A reinforced plastic structure including a plurality of laminated non-planar fiber-reinforced plastic plates having respective predetermined shapes and being fused together, said plastic structure being produced by a process comprising the steps of:
    molding and laminating said plurality of fiber-reinforced plastic plates to obtain an incompletely hardened molded structure, each said plate being separately molded in a shape which approximates the corresponding predetermined shape of said plate when fused together with the other plates; and
    hardening said molded structure including pressing and heat fusing said molded structure.

2. A method of forming a fiber-reinforced plastic composite structure, comprising the steps of:
    (a) molding and partially hardening a first fiber-reinforced plastic plate to form a pre-structure;
    (b) molding, partially hardening and laminating a further fiber-reinforced plastic plate together with said pre-structure to form a further, modified pre-structure;
    (c) repeating step (b) until said modified pre-structure includes a predetermined number of laminae; and
    (d) hardening said modified pre-structure.

3. A method of molding a fiber-reinforced plastic composite structure, comprising the steps of:
    molding and laminating a plurality of fiber-reinforced plastic plates to obtain an incompletely hardened molded structure, molding of each said plate being performed separately; and
    hardening said molded structure including pressing and heat fusing said molded structure.

4. A method as recited in claim 3, wherein said molding and laminating step comprises separately molding each of said fiber-reinforced plastic plates in an approximate shape and then laminating said molded plates to obtain said molded structure.

5. A method as recited in claim 3, wherein said molding and laminating step comprises a first step of molding a first one of said plates to form a pre-structure and then one or more subsequent sequences of laminating and molding another one of said plates to said prestructure to form another pre-structure, a final one of said pre-structures being said molded structure.

6. A method of forming a fiber-reinforced plastic composite structure, comprising the steps of:
    molding and partially hardening a plurality of fiber-reinforced plastic plates to obtain an incompletely hardened molded structure by molding a first one of said plates to form a first pre-structure, then molding, partially hardening and laminating a second one of said plates together with said first pre-structure to form a second pre-structure; and
    hardening said second pre-structure.

7. A method of forming a fiber-reinforced plastic composite structure, comprising the steps of:
    separately molding and partially hardening a plurality of fiber-reinforced plastic plates into predetermined shapes having first and second surfaces to obtain a plurality of incompletely hardened molded plates, a first surface of one of said molded plates being shaped for receiving a second surface of another of said molded plates;
    disposing said incompletely hardened molded plates adjacent to each other with said first surface of said one molded plate positioned against said second surface of said another molded plate to form an incompletely hardened molded structure; and
    hardening said molded structure including pressing and heat fusing said molded structure.

* * * * *